United States Patent
Jang et al.

(10) Patent No.: US 12,354,990 B2
(45) Date of Patent: Jul. 8, 2025

(54) SEMICONDUCTOR DEVICE AND METHOD OF FORMING AN EMBEDDED REDISTRIBUTION LAYER

(71) Applicant: STATS ChipPAC Pte. Ltd., Singapore (SG)

(72) Inventors: Junghwan Jang, Incheon (KR); Giwoong Nam, Incheon (KR); Myongsuk Kang, Incheon (KR)

(73) Assignee: STATS ChipPAC Pte. Ltd., Singapore (SG)

( * ) Notice: Subject to any disclaimer, the term of this patent is extended or adjusted under 35 U.S.C. 154(b) by 453 days.

(21) Appl. No.: 17/657,792

(22) Filed: Apr. 4, 2022

(65) Prior Publication Data
US 2023/0317663 A1 Oct. 5, 2023

(51) Int. Cl.
*H01L 21/768* (2006.01)
*H01L 23/00* (2006.01)

(52) U.S. Cl.
CPC ........ *H01L 24/19* (2013.01); *H01L 21/76807* (2013.01); *H01L 24/20* (2013.01);
(Continued)

(58) Field of Classification Search
CPC ....... H01L 21/76807; H01L 2221/1005; H01L 2221/1021; H01L 2224/0231; H01L 23/53238; H01L 21/76865; H01L 2224/02373; H01L 224/02379; H01L 2224/02311; H01L 2224/02331; H01L 224/02371; H01L 2224/02372; H01L 2224/94; H01L 21/4853; H01L 24/19; H01L 24/20; H01L 24/94; H01L 2224/19; H01L 2224/214; H01L 21/561; H01L 23/3128; H01L 23/5389; H01L 24/93; H01L 24/02; H01L 23/485; H01L 24/03; H01L 2224/02379; H01L 2224/02381; H01L 21/56; H01L 23/481; H01L 23/482; H01L 2224/0239; H01L 2224/023; H01L 2224/02313; H01L 2224/03462;
(Continued)

(56) References Cited

U.S. PATENT DOCUMENTS 5,266,446 A * 11/1993 Chang ................... H01L 21/481
438/692
5,851,913 A * 12/1998 Brennan ........... H01L 21/76807
438/622

(Continued)

*Primary Examiner* — Julio J Maldonado
*Assistant Examiner* — Paul A Berry
(74) *Attorney, Agent, or Firm* — Brian M. Kaufman; Robert D. Atkins; PATENT LAW GROUP: Atkins and Associates, P.C.

(57) ABSTRACT

A semiconductor device has a semiconductor die. A first dielectric layer is formed over the semiconductor die. A second dielectric layer is formed over the first dielectric layer. A trench is formed in the second dielectric layer. A via opening is formed to expose a contact pad of the semiconductor die within the trench. A seed layer is formed over the second dielectric layer. The seed layer extends into the trench and via opening. A conductive material is deposited into the via opening and trench. The conductive material is overburdened from the trench. The seed layer around the conductive material is etched in a first etching step. The conductive material is etched in a second etching step.

24 Claims, 14 Drawing Sheets

(52) U.S. Cl.
CPC ...... *H01L 24/94* (2013.01); *H01L 2221/1021* (2013.01); *H01L 2224/19* (2013.01); *H01L 2224/214* (2013.01); *H01L 2224/94* (2013.01)

(58) Field of Classification Search
CPC . H01L 2224/03416; H01L 2224/03418; H01L 2224/03622; H01L 2224/03618; H01L 2224/03614; H01L 2224/03612; H01L 2224/03916; H01L 21/743; H01L 21/82; H01L 25/50; H01L 21/02282; H01L 21/02697; H01L 21/0274; H01L 21/0332; H01L 21/0334; H01L 24/14; H01L 24/81; H01L 21/76871; H01L 21/76873; H01L 21/76874; H01L 21/76876; H01L 2924/00; H01L 21/768; H01L 21/76838; H01L 21/76841; H01L 21/76847; H01L 21/76849; H01L 21/76883; H10L 2221/1021

See application file for complete search history.

(56) References Cited

U.S. PATENT DOCUMENTS

| | | | |
|---|---|---|---|
| 5,914,202 A * | 6/1999 | Nguyen | G03F 1/29 430/5 |
| 6,709,973 B1 * | 3/2004 | Sakamoto | H01L 21/7684 257/E21.583 |
| 6,815,336 B1 | 11/2004 | Shue et al. | |
| 7,998,857 B2 | 8/2011 | Gurumurthy et al. | |
| 8,178,967 B2 | 5/2012 | Lee et al. | |
| 8,900,929 B2 | 12/2014 | Lin et al. | |
| 9,684,237 B2 * | 6/2017 | Mori | G03F 7/0035 |
| 10,340,251 B2 * | 7/2019 | Magnus | H01L 21/4857 |
| 2019/0115311 A1 * | 4/2019 | Yu | H01L 23/3128 |

* cited by examiner

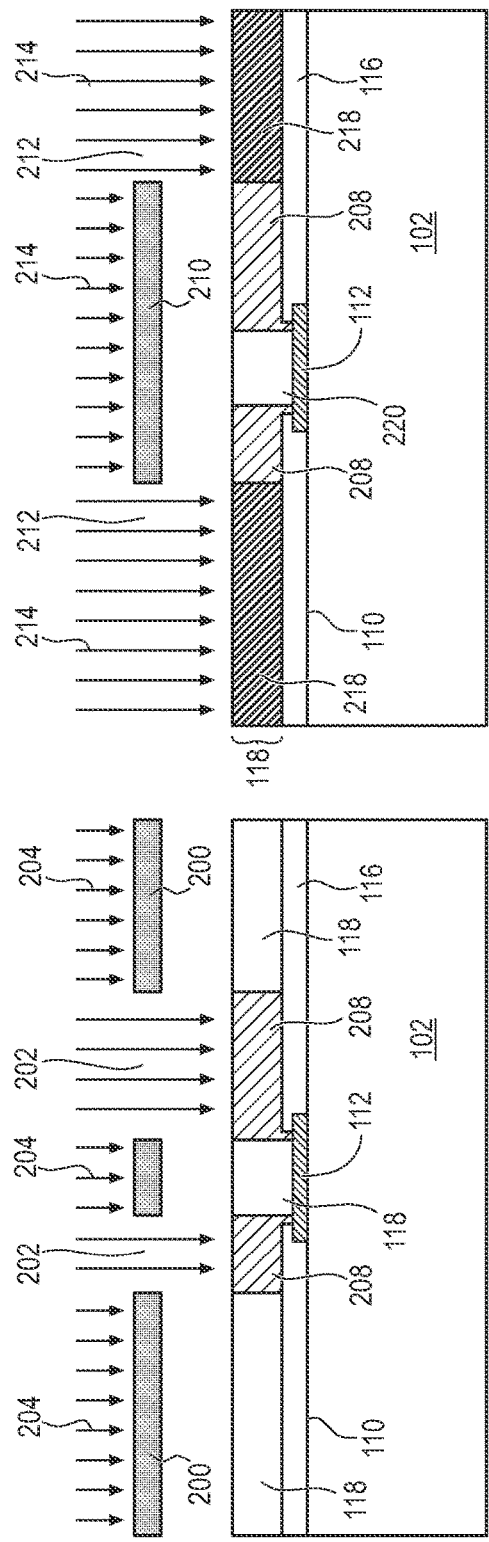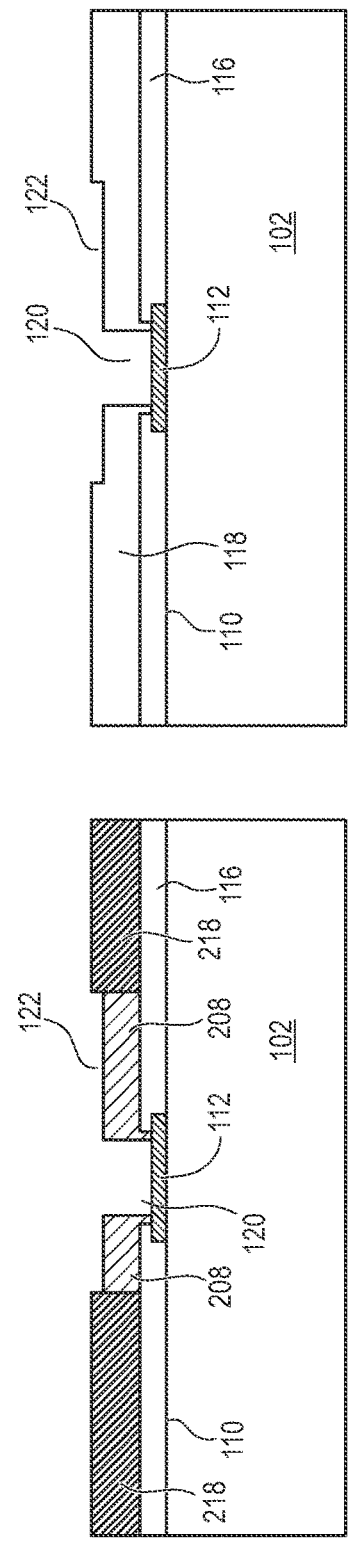

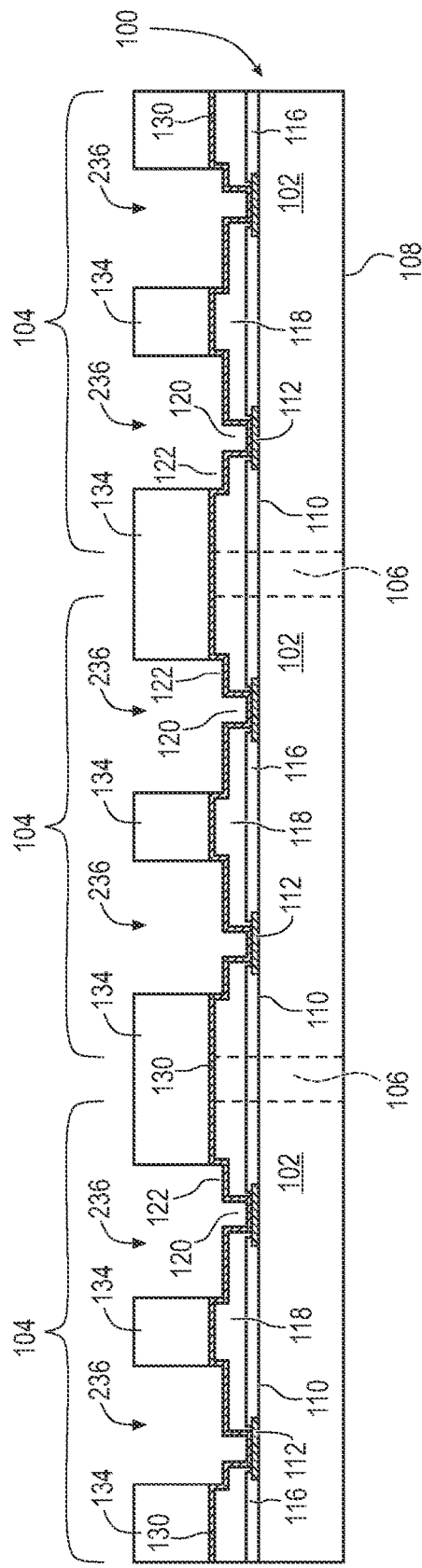
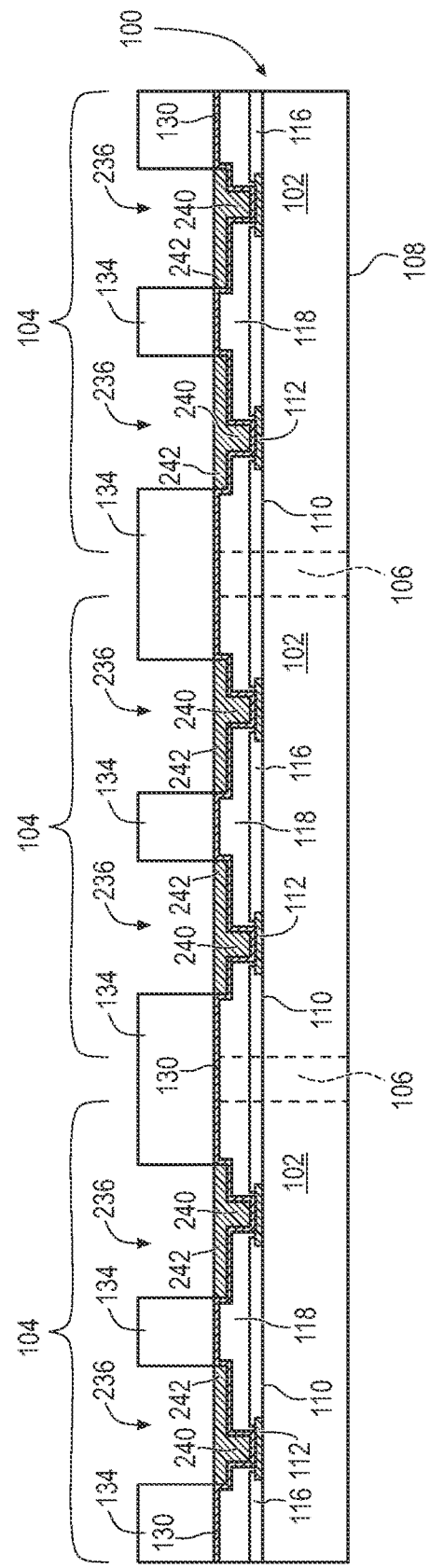
FIG. 4a
FIG. 4b

SEMICONDUCTOR DEVICE AND METHOD OF FORMING AN EMBEDDED REDISTRIBUTION LAYER

FIELD OF THE INVENTION

The present invention relates in general to semiconductor devices and, more particularly, to a semiconductor device and method of forming an embedded redistribution layer.

BACKGROUND OF THE INVENTION

Semiconductor devices are commonly found in modern electronic products. Semiconductor devices perform a wide range of functions such as signal processing, high-speed calculations, transmitting and receiving electromagnetic signals, controlling electronic devices, transforming sunlight to electricity, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor packages are increasingly migrating to fan-out technologies. In many cases, a semiconductor package will have multiple semiconductor die and multiple redistribution (RDL) layers. A non-planar top surface of one RDL represents a challenge for forming the next RDL in the stack. A non-planar surface requires a larger depth-of-field and resolution for the photolithography exposure system, among other issues.

A dual damascene process is typically used in CMOS fabrication to leave each RDL with a planar top surface. However, the dual damascene process requires a chemical-mechanical planarization (CMP) step to remove excess conductive material. The CMP step adds complexity and cost to the process flow and is an impediment for the adoption of advanced packaging. Therefore, a need exists for an improved semiconductor device and method of forming embedded RDL.

BRIEF DESCRIPTION OF THE DRAWINGS

FIGS. 2a-2d illustrate a double exposure method of patterning the RDL;

FIGS. 4a-4d illustrate an alternative process flow for depositing conductive material to form the RDL;

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, bond wires, or other suitable interconnect structure. An encapsulant or other molding compound is deposited over the package to provide physical support and electrical isolation. The finished package is then inserted into an electrical system and the functionality of the semiconductor device is made available to the other system components.

Figure 1A:
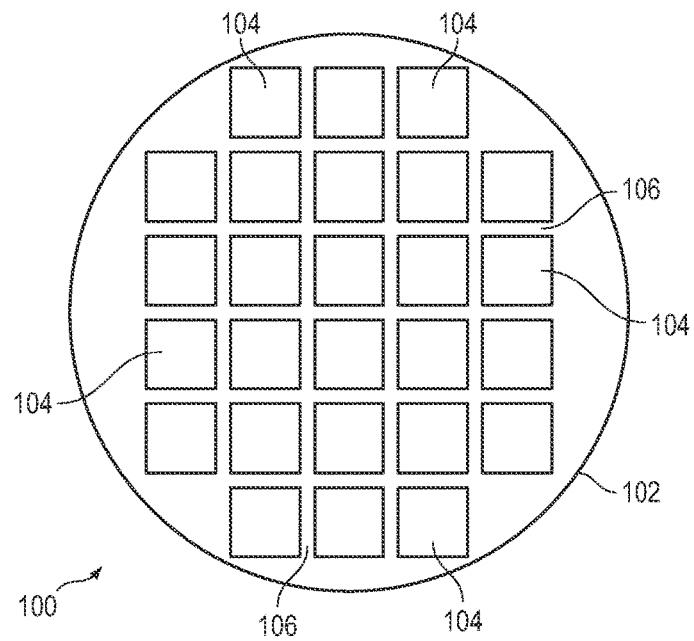
FIGS. 1a-1n illustrate a semiconductor wafer with a plurality of semiconductor die and an RDL formed over the semiconductor die.

FIG. 1a shows a semiconductor wafer 100 with a base substrate material 102, such as silicon, germanium, aluminum phosphide, aluminum arsenide, gallium arsenide, gallium nitride, indium phosphide, silicon carbide, or other bulk semiconductor material. A plurality of semiconductor die or components 104 is formed on wafer 100 separated by a non-active, inter-die wafer area or saw street 106 as described above. Saw street 106 provides cutting areas to singulate semiconductor wafer 100 into individual semiconductor die 104. In one embodiment, semiconductor wafer 100 has a width or diameter of 100-450 millimeters (mm).

Figure 1B:
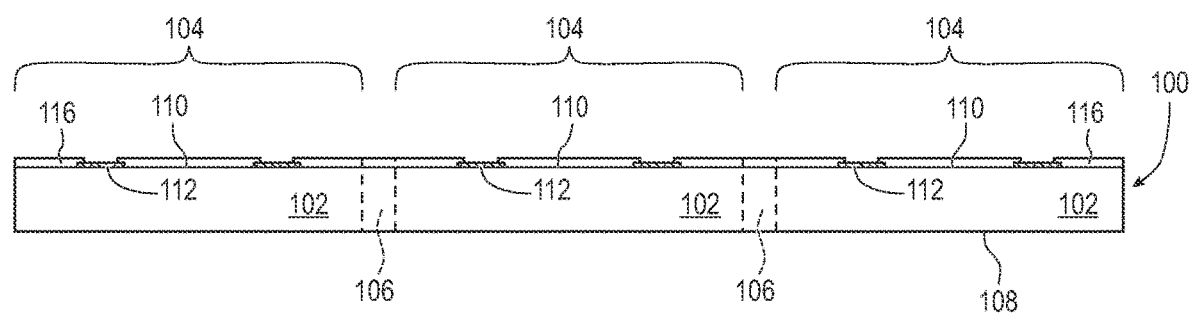

FIG. 1B shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within or over the die and electrically interconnected according to the electrical design and function of the die. For example, the circuit may include one or more transistors, diodes, and other circuit elements formed within active surface 110 to implement analog circuits or digital circuits, such as digital signal processor (DSP), ASIC, MEMS, memory, or other signal processing circuit. Semiconductor die 104 may also contain integrated passive devices (IPDs), such as inductors, capacitors, and resistors, for RF signal processing. Back surface 108 of semiconductor wafer 100 may undergo an optional backgrinding operation with a mechanical grinding or etching process to remove a portion of base material 102 and reduce the thickness of semiconductor wafer 100 and semiconductor die 104.

An electrically conductive layer 112 is formed over active surface 110 using PVD, CVD, electrolytic plating, electroless plating, or other suitable metal deposition process. Conductive layers 112 include one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

Conductive layer 112 can be formed as contact pads disposed side-by-side a first distance from the edge of semiconductor die 104, as shown in FIG. 1B. Alternatively, conductive layer 112 can be formed as contact pads that are offset in multiple rows such that a first row of contact pads is disposed a first distance from the edge of the die, and a second row of contact pads alternating with the first row disposed a second distance from the edge of the die. Conductive layer 112 represents just one conductive layer formed over semiconductor die 104 with contact pads for subsequent electrical interconnect to a larger system. However, there may be one or more intermediate conductive and insulating layers formed between the actual semiconductor devices on active surface 110 and contact pads 112 for signal routing.

A dielectric layer 116 is formed over semiconductor wafer 100 as part of the wafer manufacturing process to protect active surface 110. Opening are typically formed through dielectric layer 116 for electrical connections to be made. Dielectric layer 116 is formed from polyimide (PI), polybenzoxazole (PBO), or another suitable dielectric, passivation, or insulating material.

A dielectric layer 118 is formed over dielectric layer 116. Dielectric layer 118 is a repassivation layer formed by an outsourced semiconductor assembly and test (OSAT) firm for extra protection. Dielectric layer 118 can be formed from the above-mentioned materials for dielectric layer 116, or any other suitable insulating material. Dielectric layers 116 and 118 can be formed of the same or a different material. In some embodiments, a single thicker layer of dielectric is used rather than two separate dielectric layers.

Figure 1C:
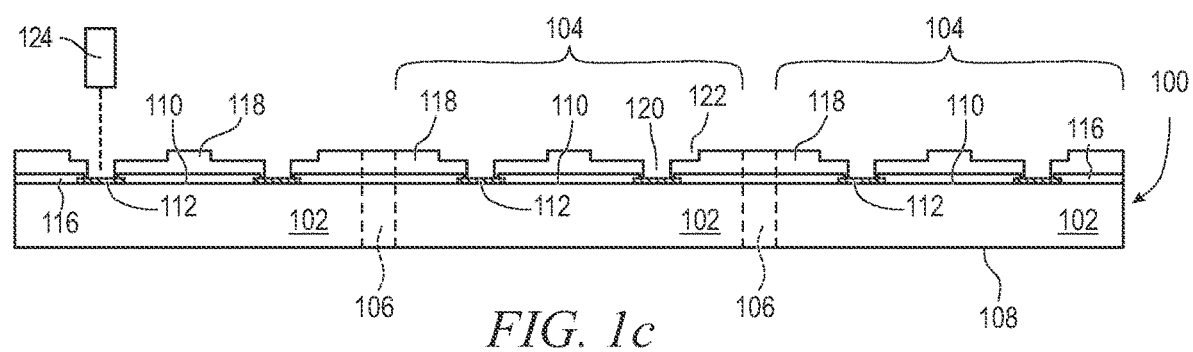

In FIG. 1c, openings are formed in an RDL pattern in dielectric layers 116 and 118 using a laser 124 to ablate the desired pattern into the dielectric layers. Trenches 122 are formed in the desired redistribution pattern, e.g., a fan-in or fan-out pattern, in second dielectric layer 118. Trenches 122 will become conductive traces after being filled with conductive material. Trenches 122 extend directly over contact pads 112, where via openings 120 are formed down to the contact pads. Via openings 120 are formed through the openings in dielectric layer 116, or through the first dielectric layer, if necessary, to expose contact pads 112 to trenches 122.

In one embodiment, trenches 122 are formed using a first laser ablation step, and then via openings 120 are formed using a second laser ablation step. Openings 120 can be formed simply by concentrating laser 124 over contact pads 112 for a longer period of time compared to the rest of the RDL pattern.

Figure 1D:
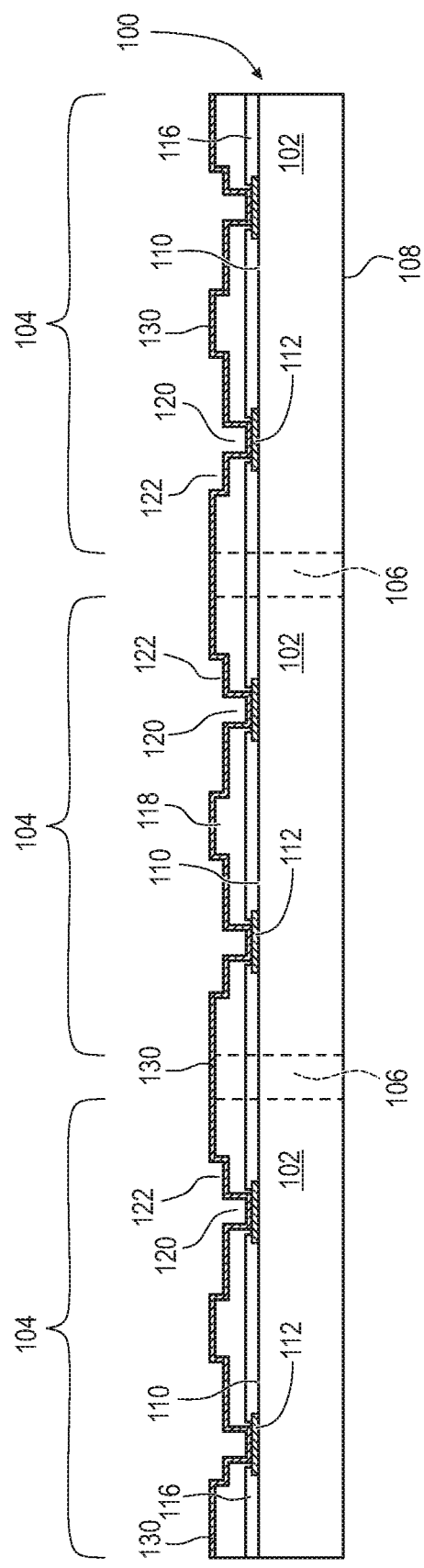

In FIG. 1d, a seed layer 130 is formed over semiconductor wafer 100. Seed layer 130 is formed using any suitable metal deposition technique, e.g., chemical vapor deposition, physical vapor deposition, other sputtering methods, spraying, or plating. The sputtered material is typically titanium, titanium-tungsten, or titanium-copper, but can also be copper, steel, aluminum, gold, combinations thereof, or any other suitable conductive material.

Seed layer 130 is a conformal layer, meaning a substantially uniform thickness of material is deposited on every exposed surface including both horizontal and vertical surfaces. Seed layer 130 extends down side surfaces of second dielectric layer 118 into trenches 122 and down side surfaces of first dielectric layer 116 into via openings 120. Seed layer 130 is physically and electrically connected to contact pads 112 in via openings 120. Seed layer 130 extends across the top surface of second dielectric layer 118 to completely blanket semiconductor wafer 100 and interconnect all contact pads 112.

Figure 1E:
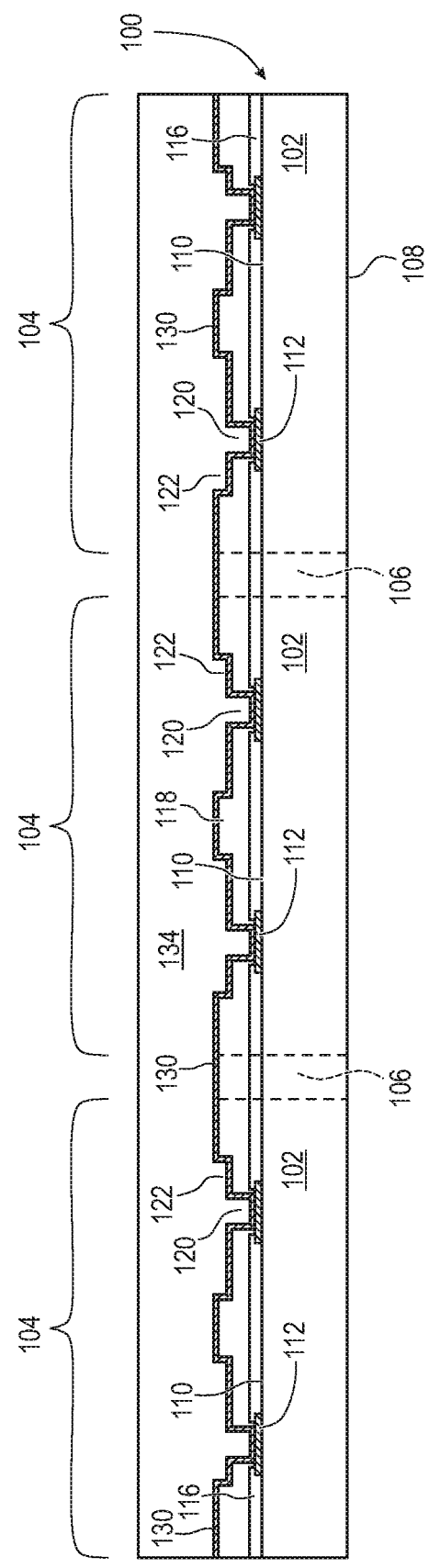

In FIG. 1e, a photoresist layer 134 is formed over seed layer 130. Photoresist layer 134 completely covers wafer 100. Photoresist layer 134 is exposed to light through a mask such that light hits the photoresist layer in a similar pattern as trenches 122.

Figure 1F:
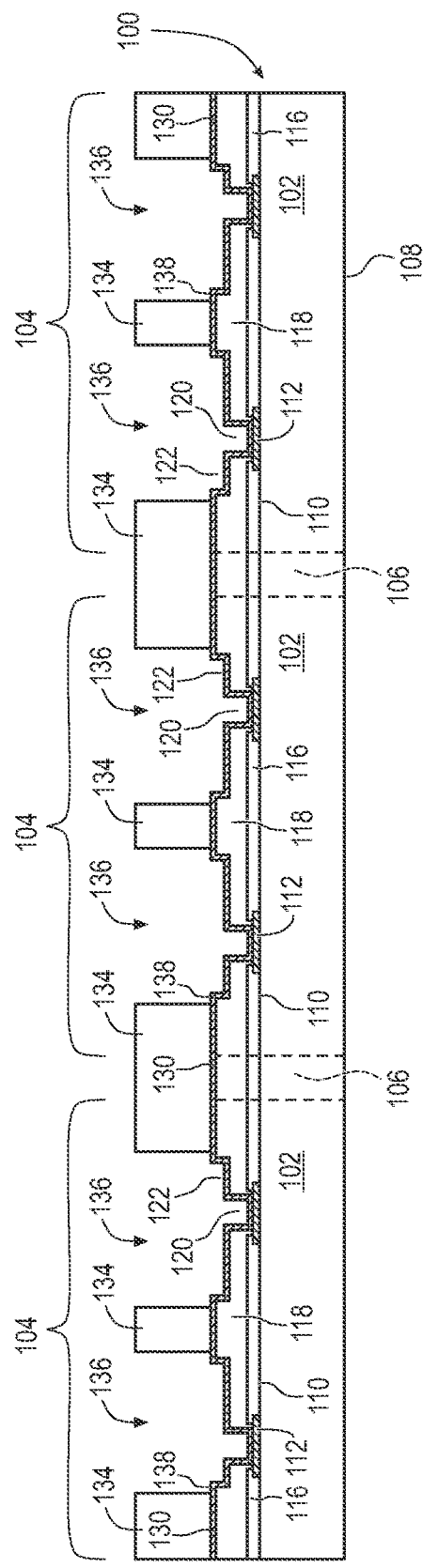

In FIG. 1f, a developer is used to rinse away the portions of photoresist layer 134 that were exposed to light to form trenches 136. A negative photoresist is used in other embodiments. Trenches 136 formed through photoresist layer 134 fully expose seed layer 130 within the underlying vias 120 and trenches 122. Trenches 136 in photoresist layer 134 are wider than trenches 122 in second dielectric layer 120 to leave a lip 138 exposed around each trench 122.

Figure 1G:
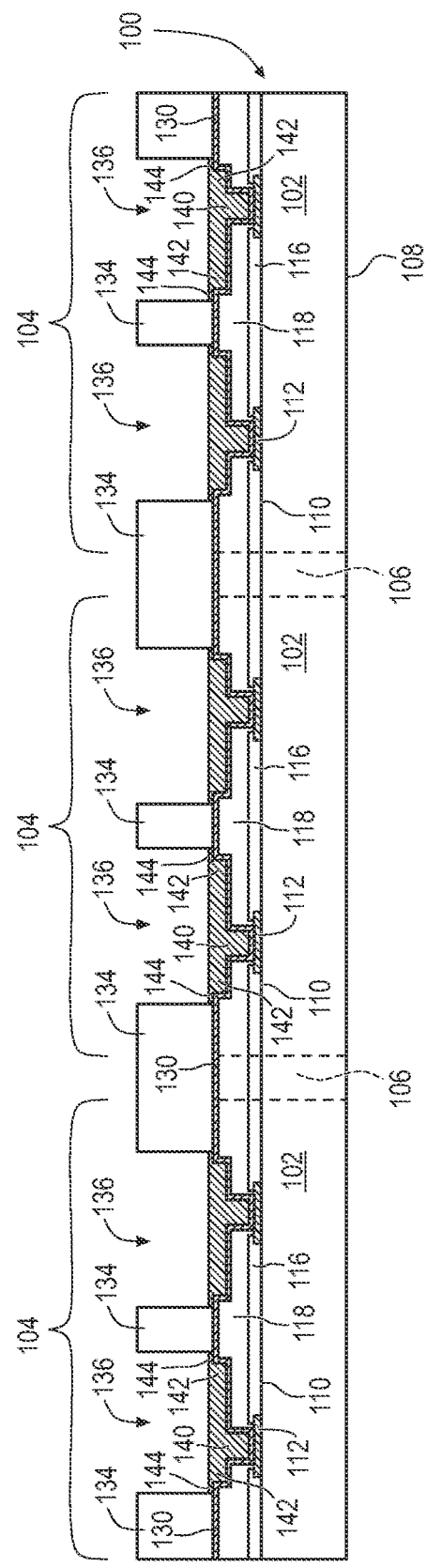

In FIG. 1g, a conductive material 140-144 is deposited into trenches 136 using a bottom-up filling deposition method. The conductive material filling forms conductive vias 140 within via openings 120, conductive traces 142 within trenches 122, and flanges 144 on lips 138. The conductive material is typically copper, but gold, aluminum, titanium, tin, iron, nickel, combinations thereof, and other suitable conductive materials can be used in other embodiments.

Trenches 122 of second dielectric layer 118 are overfilled to form sacrificial flanges 144 on lips 138. Flange 144 in combination with the excess conductive material directly over trenches 122 and via openings 120 forms an overburden. Conductive material 140-144 is filled into trenches 136 until the conductive material is proud of the top surface of second dielectric layer 118. Conductive material is deposited into trenches 136 until flanges 144 are approximately 1-2 μm thick in one embodiment.

Figure 1H:
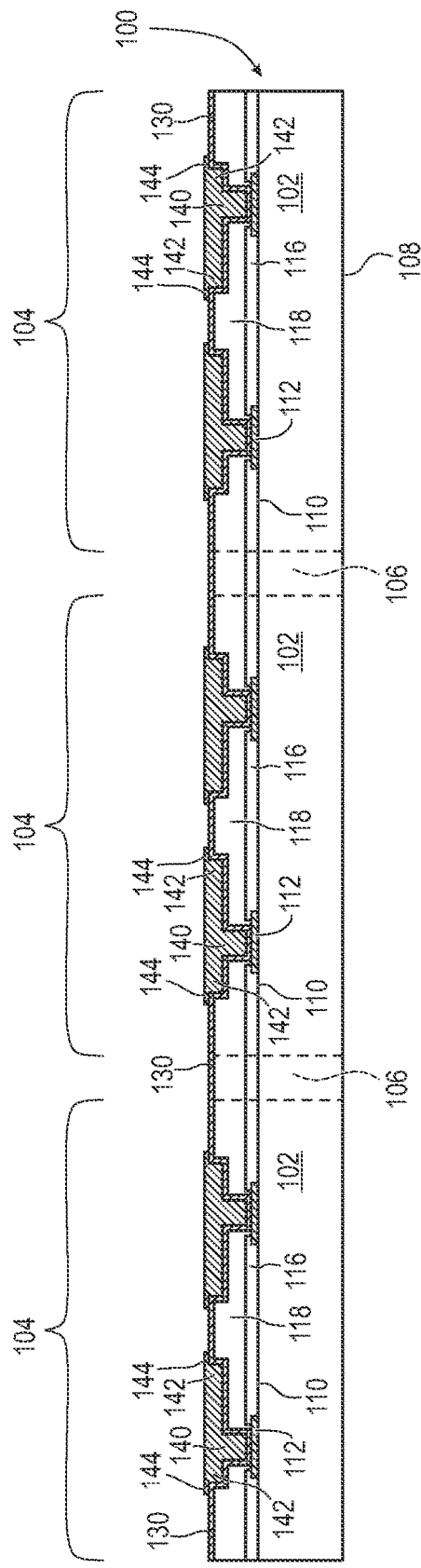
Figure 1I:
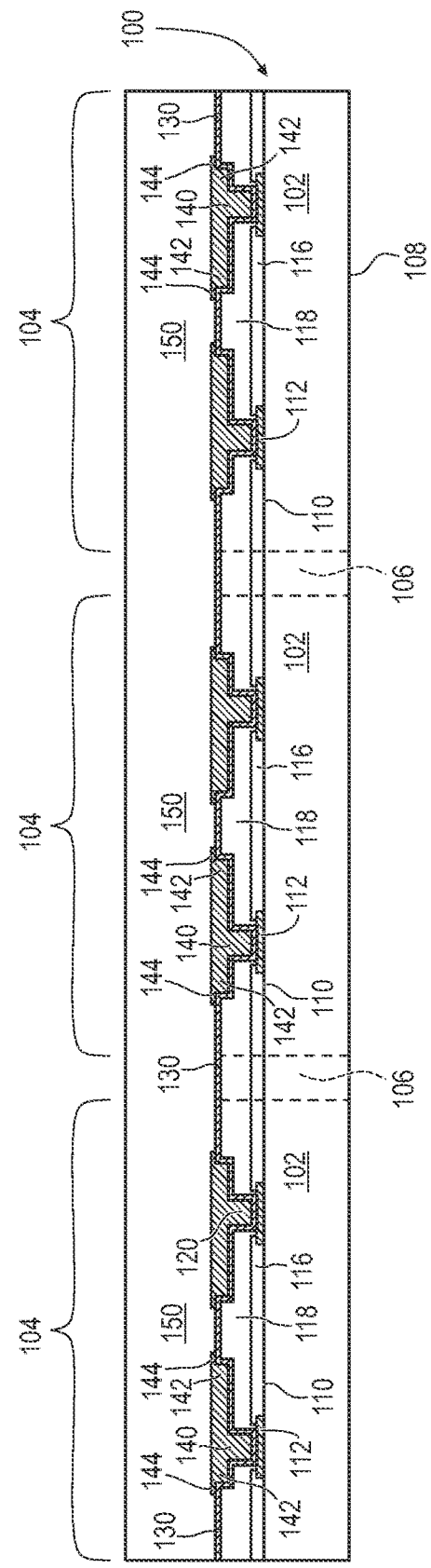
Figure 1J:
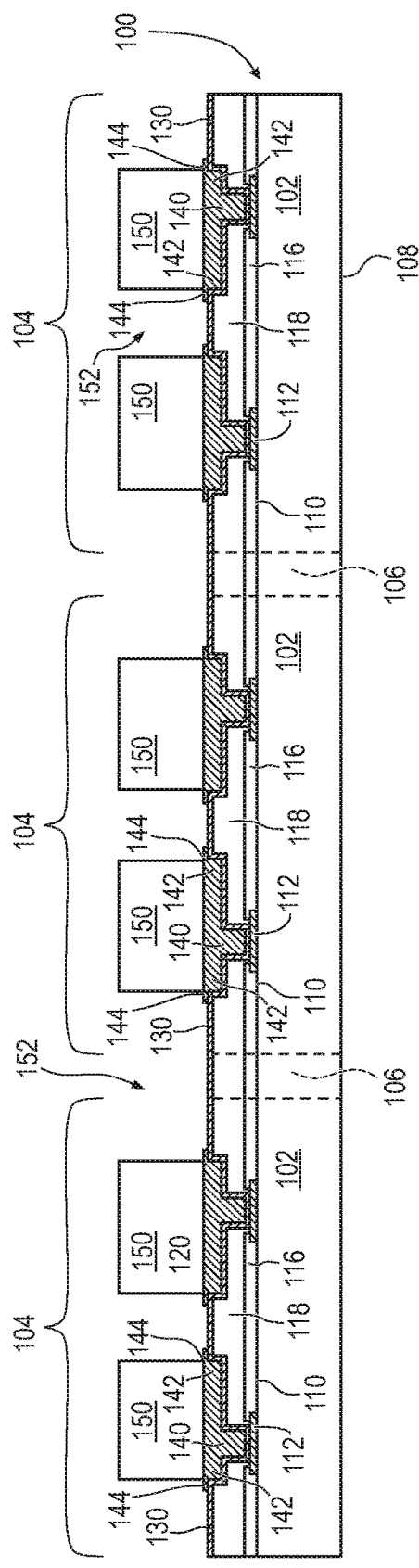

Remaining portions of photoresist layer 134 are removed in FIG. 1h to leave conductive material 140-144 in the pattern of conductive traces 142 overburdened to form flanges 144. A second photoresist layer 150 is formed completely covering wafer 100 in FIG. 1i. In FIG. 1j, photoresist 150 is exposed to light and developed to remove the portion of the second photoresist outside of conductive traces 142. Openings 152 through photoresist 150 expose flanges 144 and portions of seed layer 130 not covered by conductive material 140-144. The remaining portions of photoresist 150 have a similar or the same footprint as respective underlying conductive traces 142.

Figure 1K:
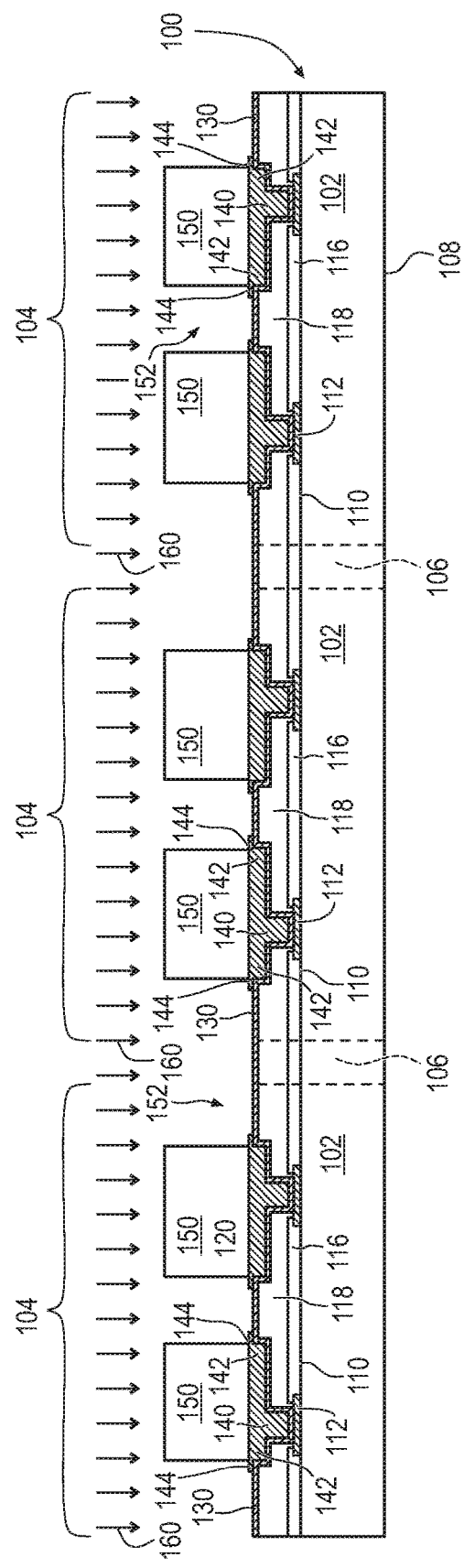

In FIG. 1k, a seed etching 160 step occurs, signified by arrows drawn on the figure. The seed etching 160 occurs with a chemical or other mechanism that is selective to the material of seed layer 130. Seed etching 160 can be a wet or dry method. Seed layer 130 is removed between areas of conductive material 140-144 while photoresist layer 150 protects conductive traces 142 from the etching process. Flanges 144 may be slightly etched by seed etching 160 but are not fully removed due to the selective nature of the etching. The portions of seed layer 130 under flanges 144 are not removed due to being protected from etching by the flanges.

Figure 1L:
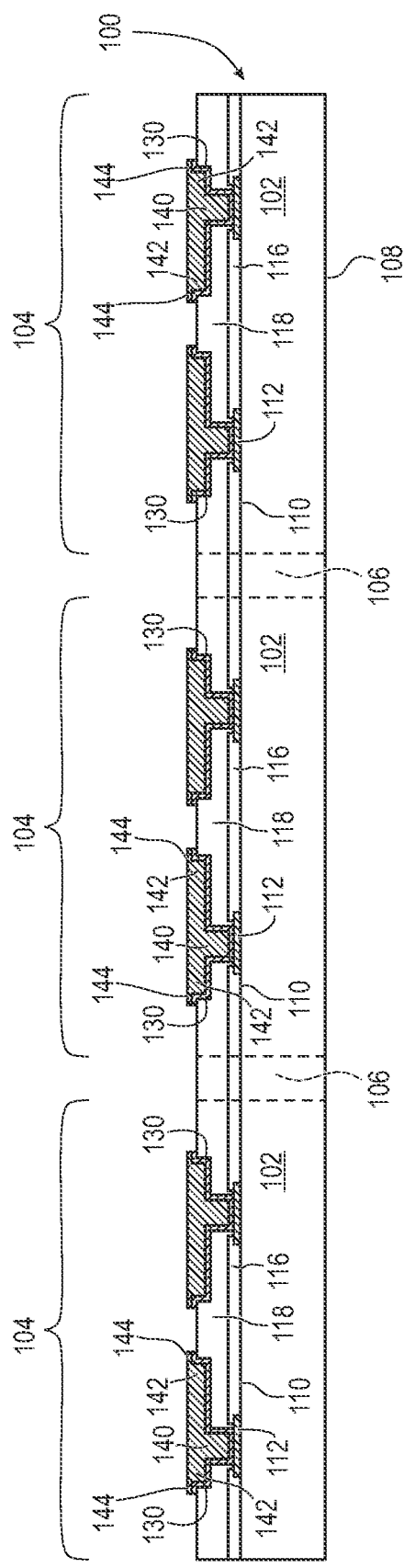

The remaining portions of photoresist layer 150 are removed in FIG. 1l. Conductive material 140-144 remains, along with the portions of seed layer 130 under the conductive material, while the seed layer has been removed between the discrete portions of conductive material. Conductive material 140-144 remains overburdened to second dielectric layer 118.

Figure 1M:
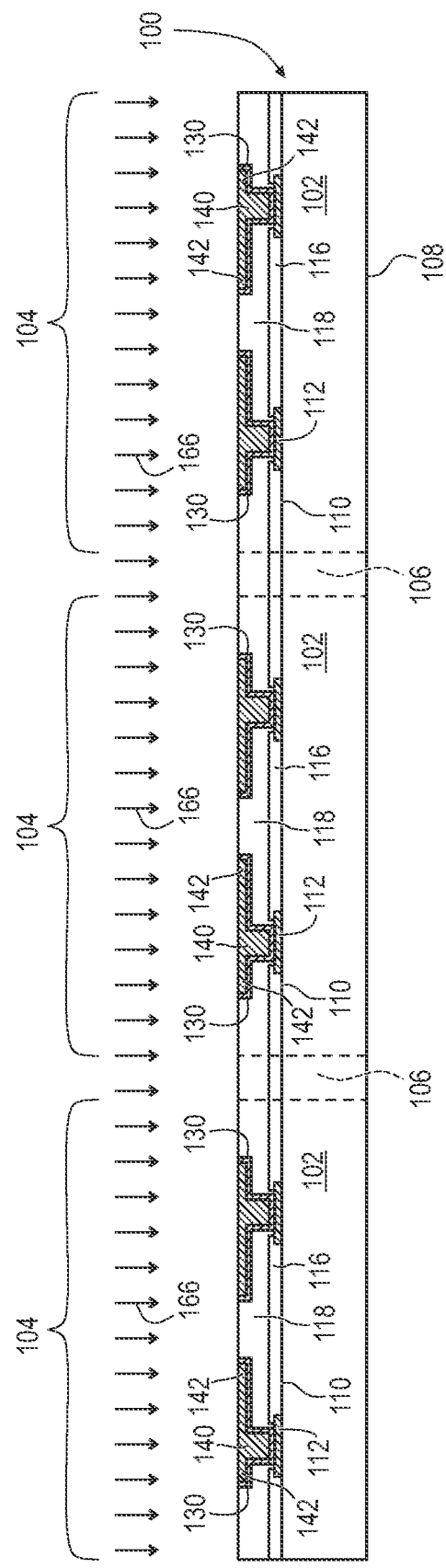

In FIG. 1m, a second etching 166 step occurs, signified by arrows in the figure. Etching 166 uses a different chemical or process that is effective to remove both conductive material 140-144 and seed layer 130. Etching 166 removes the top portion of conductive material 140-144 over time and continues until flanges 144 are removed and a top surface of conductive traces 142 are coplanar or approximately coplanar to a top surface of second dielectric layer 118.

Second dielectric layer 118 may be used as an etch-stop layer by revealing when flanges 144 are fully removed because more of the second dielectric layer is visible when etching is complete. The portion of seed layer 130 under flanges 144 is also removed, but the seed layer remains under conductive traces 142 and conductive vias 140. Conductive traces 142 remain in the desired redistribution pattern with top surfaces approximately coplanar to the top surface of second dielectric layer 118. In some embodiments, conductive traces 142 are shaped to include contact pads where a subsequently formed RDL layer or other interconnect structure will connect to the conductive traces.

Figure 1N:
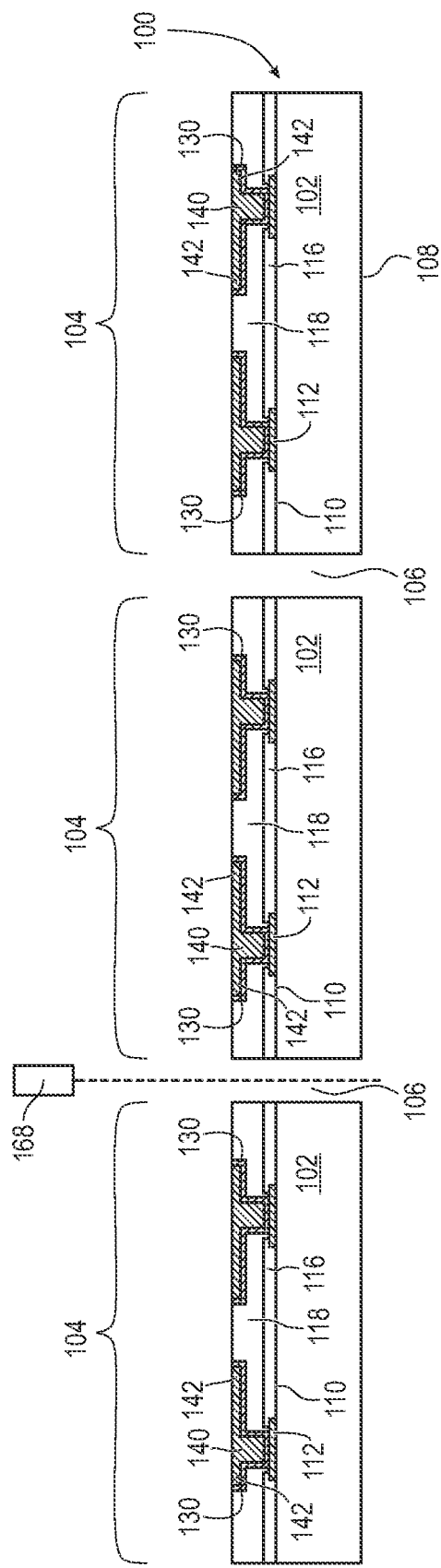

In FIG. 1n, semiconductor wafer 100 is singulated through saw street 106 using a saw blade or laser cutting tool 168 into individual semiconductor die 104. The individual semiconductor die 104 can be inspected and electrically tested for identification of KGD post-singulation. In other embodiments, additional conductive layers are formed prior to singulation to allow for more complicated routing. Every layer in a multiple RDL stack on semiconductor die 104 can be formed as above described.

Semiconductor die 104 can be stored in a tape-and-reel or other storage for later packaging or directly incorporated into fan-out semiconductor packages. Forming conductive traces 142 with top surfaces that are coplanar to the surrounding dielectric layer 118 eases processing requirements for packaging semiconductor die 104. Forming the coplanar surfaces without requiring chemical mechanical planarization (CMP) means that the semiconductor die 104 manufacturing process is cheaper and simpler.

FIGS. 2a-2d show forming trenches 122 and via openings 120 using a double-exposure photolithography as an alternative to the laser ablation shown in FIG. 1c. In FIG. 2a, a first mask 200 is disposed over wafer 100. Mask 200 includes openings 202 formed in the desired pattern for trenches 122, excluding where the trenches overlap via openings 120. When dielectric layer 118 is first deposited over wafer 100 the second dielectric layer is light sensitive. Radiation 204 is exposed to wafer 100 through mask 200, and hits dielectric layer 118 in the pattern of openings 202. Radiation 202 is relatively weak so that the material in region 208 under openings 202 is only partially cross-linked. Region 208 of dielectric layer 118 is only partially hardened by radiation 204 and remains slightly soft.

In FIG. 2b, a second mask 210 is disposed over wafer 100. Mask 210 covers the desired pattern for trenches 122 including via openings 120. Openings 212 are formed over other areas of wafer 100. Radiation 214 is exposed onto dielectric layer 118 through openings 212. Radiation 214 is relatively stronger than radiation 204 was, so that areas 218 of dielectric layer 118 are hardened to a greater strength than areas 208 were. Region 220 over contact pad 112 remains unexposed to both radiation 204 and 214.

In FIG. 2c, a developer is used to wash away portions of dielectric layer 118 that were not exposed to light. Region 220 over contact pad 112 is fully removed while regions 208 that were exposed to a weak light 204 are only partially removed. After developing, dielectric layer 118 is cured in FIG. 2d.

Figure 3:
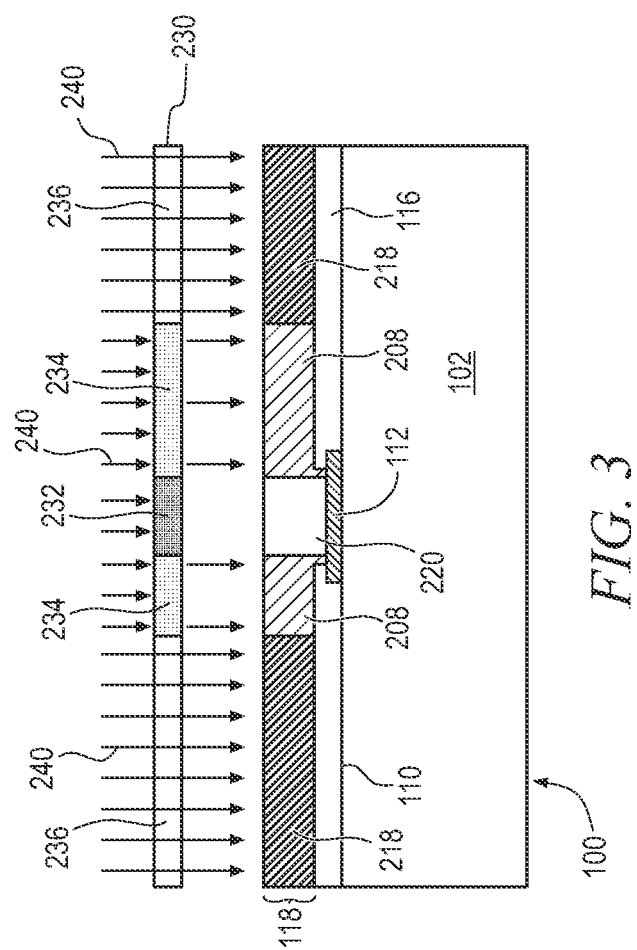
FIG. 3 illustrates a half-tone mask used to pattern the RDL.

FIG. 3 shows a half-tone mask 230 used to expose all desired areas of dielectric layer 118 to light in a single step. Mask 230 has different discrete areas with varying light transmittance. Area 232 of mask 230 over contact pad 112 is fully opaque, area 234 over the desired location of trench 122 is partially transmissive, and area 236 around the trenches is fully transmissive. In one embodiment, area 232 is approximately 0% transmissive, area 234 is approximately 50% transmissive, and area 236 is approximately 100% transmissive.

Radiation 240 is exposed onto wafer 100 through mask 230. Radiation 240 passes through area 236 at a greater intensity than the radiation passes through area 234. Area 232 fully blocks transmission of radiation 240. Therefore, area 218 of dielectric layer 118 is exposed to a stronger portion of light radiation 240 than area 208, and area 220 is not significantly exposed to the radiation. As shown in FIGS. 2c and 2d above, dielectric layer 118 is developed and cured to complete formation of trenches 122 and via openings 120 in dielectric layer 118.

Figures 4C, 4D:
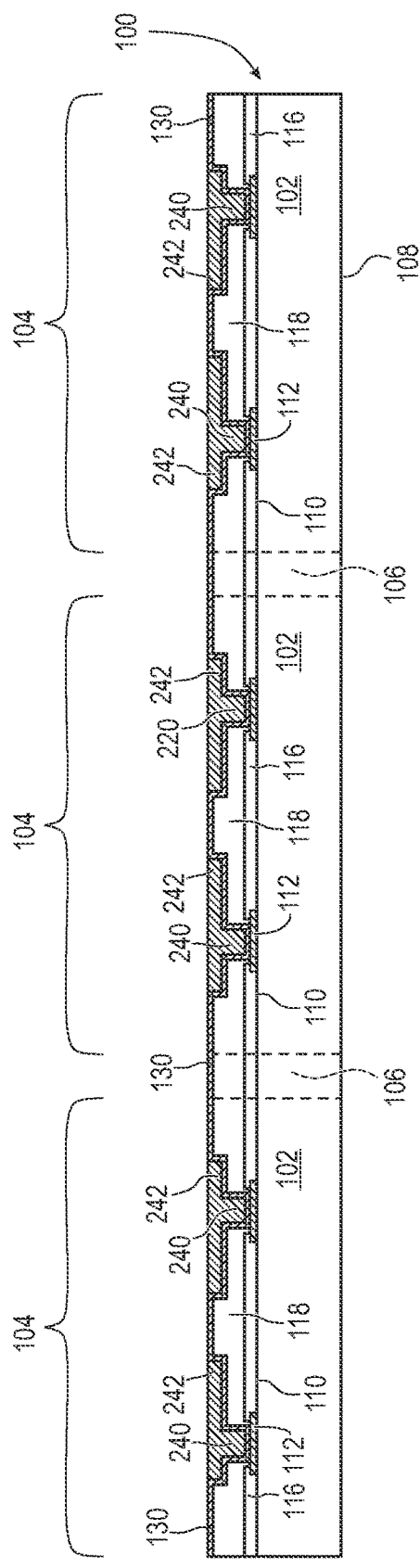

FIGS. 4a-4d show an alternative process of filling trenches 122 and via openings 120 with conductive material as an alternative to the process shown in FIGS. 1f-1m. In FIG. 4a, openings 236 are formed in photoresist layer 134. Openings 236 are similar to openings 136 above but slightly smaller. Openings 236 have identical or nearly the same footprints as trenches 122, whereas openings 136 were slightly larger.

In FIG. 4b, conductive material is deposited into openings 236 to form conductive vias 240 in via openings 120 and RDL pattern 242 in trenches 122. A bottom-up filling of conductive material is done to control the fill level and form an RDL with top surfaces coplanar to the top surface of dielectric layer 118. Conductive material may be deposited slightly proud of dielectric layer 118 and then removed like above, but flanges 144 are not formed as above due to the size of openings 236 being smaller than openings 136.

FIG. 4c shows photoresist layer 134 removed as in FIG. 1h. In FIG. 4d, a seed layer etching step 160 is performed as above to remove seed layer 130 between the portions of RDL pattern 240. Semiconductor die 104 are then singulated from each other as shown in FIG. 1n.

Figure 5:
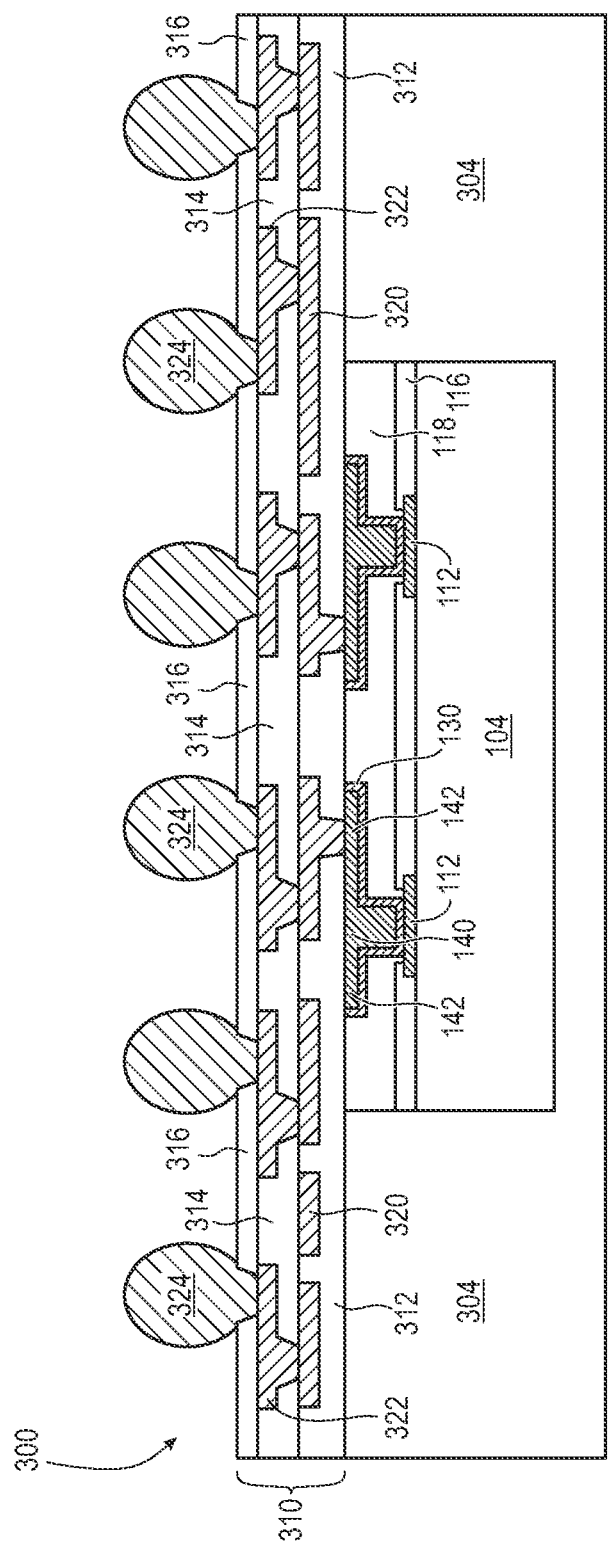
FIG. 5 illustrates a fan-out semiconductor package with the semiconductor die.

FIG. 5 shows an exemplary fan-out package 300 formed with semiconductor die 104 after forming either RDL pattern 142 or 242. Semiconductor die 104 is embedded in a molding compound or encapsulant 304. Encapsulant 304 is deposited over semiconductor die 104 while a plurality of semiconductor die is disposed on a carrier with active surfaces 110 oriented toward the carrier. Being face-down results in semiconductor die 104 with encapsulant 304 having a surface coplanar to a top surface of second dielectric layer 118 due to the second dielectric layer being in contact with the carrier while molding. Encapsulant 304 extends over back surface 108 opposite the carrier but can optionally be backgrinded or film-assist molded to leave the back exposed.

Encapsulant 304 can be a polymer composite material, such as an epoxy resin, epoxy acrylate, or polymer with or without a filler added. Encapsulant 304 is non-conductive and environmentally protects the semiconductor device from external elements and contaminants. Encapsulant 304 also protects semiconductor die 104 from degradation due to exposure to light.

A build-up interconnect structure 310 is formed over active surface 110 of semiconductor die 104 and encapsulant 304. Build-up interconnect structure 310 is formed over a larger surface area than that of semiconductor die 104 due to the presence of encapsulant 304. Encapsulant 304 provides additional surface area for build-up interconnect structure 304 to fan-out. In some embodiments, first dielectric layer 116 is formed over semiconductor die 104 at the end of manufacturing of semiconductor wafer 100, and second dielectric layer 118 is formed over both semiconductor die 104 and encapsulant 304 by an OSAT firm as part of forming fan-out build-up interconnect structure 310. Conductive traces 142 optionally extend over encapsulant 304.

Build-up interconnect structure 310 includes first dielectric layer 312, second dielectric layer 314, and a solder mask layer 316. A first conductive layer 320 is formed between dielectric layers 312 and 314. Conductive layer 320 includes conductive vias through insulating layer 312 to contact conductive traces 142. A second conductive layer 322 is formed over or in dielectric layer 314. Conductive layer 322 includes conductive vias through insulating layer 314 to contact conductive layer 320. Conductive layers 320 and 322 can be formed embedded in insulating layers 312 and 314, respectively, as described above without requiring a chemical-mechanical planarization.

Each RDL layer, consisting of a conductive layer and insulating layer pair, has a planar top surface, which eases requirements for subsequently formed layers. Any number of insulating and conductive layer pairs can be formed interleaved over semiconductor die 104 and encapsulant 304 as required to implement the desired signal routing. In other embodiments, a build-up interconnect structure is formed over semiconductor die 104 and encapsulant 304 using any suitable process.

An electrically conductive bump material is deposited over conductive layer 322, within openings of solder mask layer 316, using an evaporation, electrolytic plating, electroless plating, ball drop, or screen printing process. The bump material can be Al, Sn, Ni, Au, Ag, lead (Pb), bismuth (Bi), Cu, solder, and combinations thereof, with an optional flux solution. For example, the bump material can be eutectic Sn/Pb, high-lead solder, or lead-free solder. The bump material is bonded to conductive layer 322 using a suitable attachment or bonding process. The bump material can be reflowed by heating the material above its melting point to form conductive balls or bumps 324. In one embodiment, conductive bumps 324 are formed over an under bump metallization (UBM) having a wetting layer, barrier layer, and adhesion layer. Conductive bumps 324 can also be compression bonded or thermocompression bonded to conductive layer 322. Conductive bumps 324 represent one type of interconnect structure that can be formed over conductive layer 322 for electrical connection to a substrate. The interconnect structure can also use bond wires, conductive paste, stud bump, micro bump, conductive pillars, or other electrical interconnect. A plurality of semiconductor packages 300 is normally formed in a panel or reconstituted wafer, and then singulated through encapsulant 304 after completion.

Figure 6A:
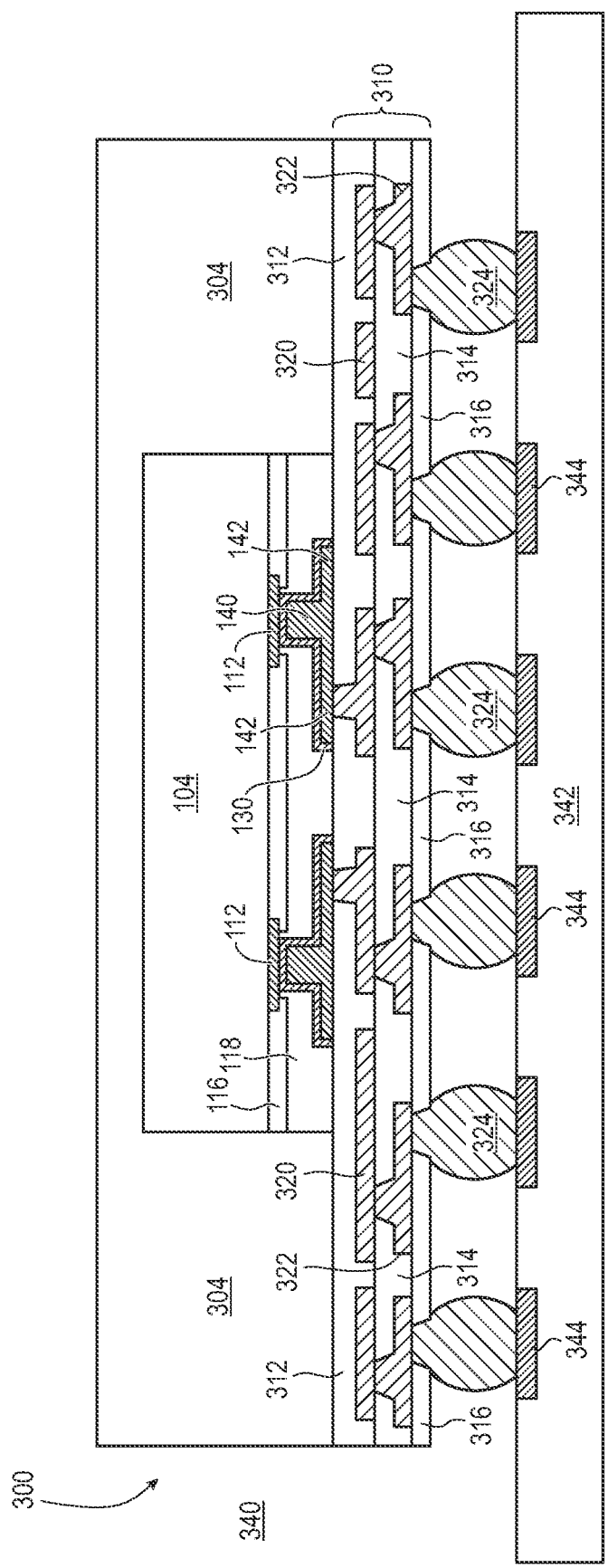
FIGS. 6a and 6b illustrate integrating the semiconductor package into an electronic device.
Figure 6B:
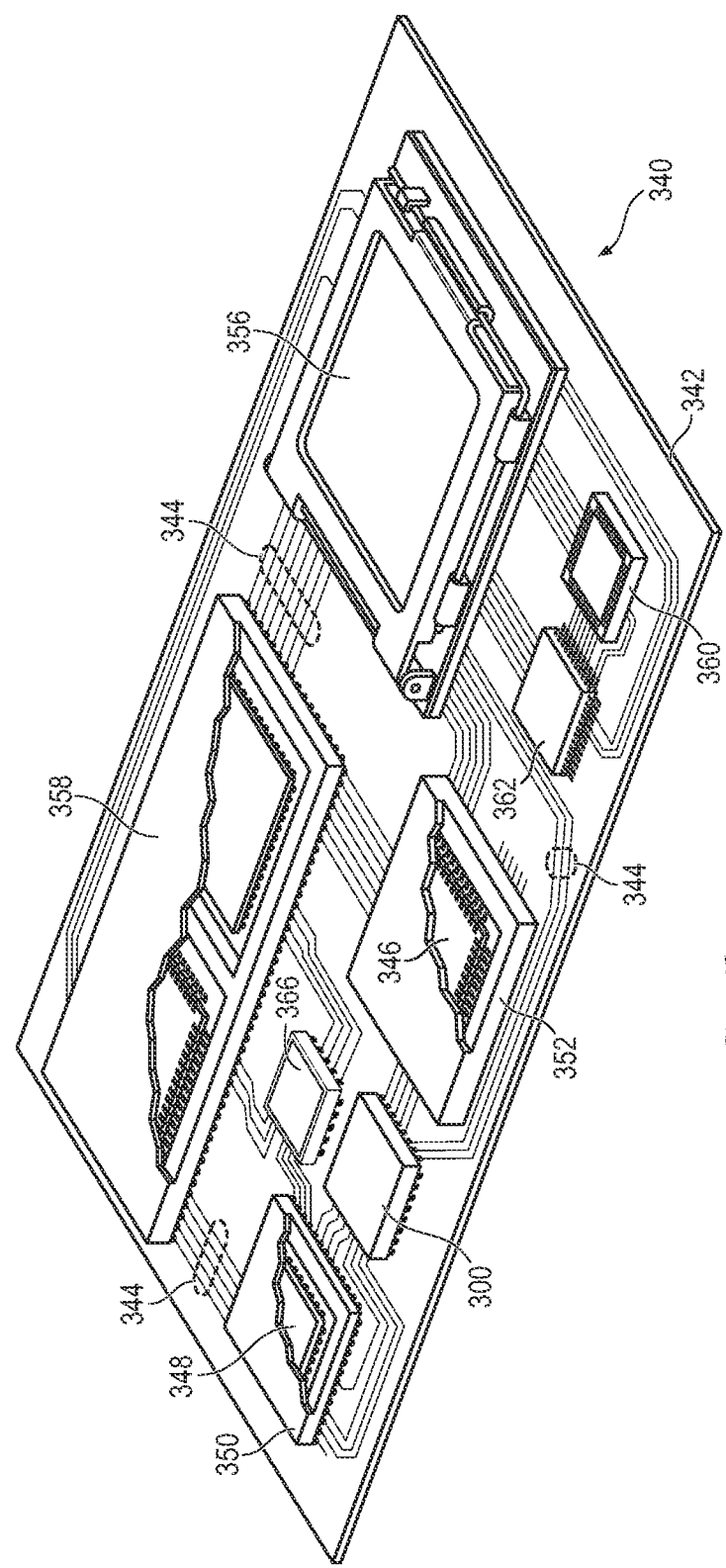

FIGS. 6a and 6b illustrate integrating the above-described semiconductor packages, e.g., semiconductor package 300, into a larger electronic device 340. FIG. 6a illustrates a partial cross-section of semiconductor package 300 mounted onto a printed circuit board (PCB) or other substrate 342 as part of electronic device 340. Bumps 324 are reflowed onto conductive layer 344 of PCB 342 to physically attach and electrically connect semiconductor package 300 to the PCB. In other embodiments, thermocompression or other suitable attachment and connection methods are used. In some embodiments, an adhesive or underfill layer is used between semiconductor package 300 and PCB 342. Semiconductor die 104 is electrically coupled to conductive layer 344 through build-up interconnect structure 310, conductive traces 142, and conductive vias 140.

FIG. 6b illustrates electronic device 340 including PCB 342 with a plurality of semiconductor packages mounted on a surface of the PCB, including semiconductor package 300. Electronic device 340 can have one type of semiconductor package, or multiple types of semiconductor packages, depending on the application. Electronic device 340 can be a stand-alone system that uses the semiconductor packages to perform one or more electrical functions. Alternatively, electronic device 340 can be a subcomponent of a larger system. For example, electronic device 340 can be part of a tablet computer, cellular phone, digital camera, communication system, or other electronic device. Electronic device 340 can also be a graphics card, network interface card, or another signal processing card that is inserted into a computer. The semiconductor packages can include microprocessors, memories, ASICs, logic circuits, analog circuits, RF circuits, discrete active or passive devices, or other semiconductor die or electrical components.

PCB 342 provides a general substrate for structural support and electrical interconnection of the semiconductor packages mounted on the PCB. Conductive signal traces 344 are formed over a surface or within layers of PCB 342 using evaporation, electrolytic plating, electroless plating, screen printing, or other suitable metal deposition process. Signal traces 344 provide for electrical communication between the semiconductor packages, mounted components, and other external systems or components. Traces 344 also provide power and ground connections to the semiconductor packages as needed.

In some embodiments, a semiconductor device has two packaging levels. First level packaging is a technique for mechanically and electrically attaching the semiconductor die to an intermediate substrate. Second level packaging involves mechanically and electrically attaching the intermediate substrate to PCB 342. In other embodiments, a semiconductor device may only have the first level packaging where the die is mechanically and electrically mounted directly to PCB 342.

For the purpose of illustration, several types of first level packaging, including bond wire package 346 and flipchip 348, are shown on PCB 342. Additionally, several types of second level packaging, including ball grid array (BGA) 350, bump chip carrier (BCC) 352, land grid array (LGA) 356, multi-chip module (MCM) 358, quad flat non-leaded package (QFN) 360, quad flat package 362, and embedded wafer level ball grid array (eWLB) 366 are shown mounted on PCB 342 along with semiconductor package 300. Conductive traces 344 electrically couple the various packages and components disposed on PCB 342 to semiconductor package 300, giving use of semiconductor die 104 to other components on the PCB.

Depending upon the system requirements, any combination of semiconductor packages, configured with any combination of first and second level packaging styles, as well as other electronic components, can be connected to PCB 342. In some embodiments, electronic device 340 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using less expensive components and a streamlined manufacturing process. The resulting devices are less likely to fail and less expensive to manufacture resulting in a lower cost for consumers.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a first dielectric layer over the semiconductor die;
   forming a second dielectric layer over the first dielectric layer;
   forming a trench in the second dielectric layer;
   forming a via opening to expose a contact pad of the semiconductor die within the trench;
   forming a seed layer over the second dielectric layer, wherein the seed layer extends into the trench and via opening;
   depositing a conductive material in the via opening and trench, wherein the conductive material is overburdened from the trench and a portion of the seed layer remains exposed from the conductive material;
   forming a photoresist layer over the conductive material in the trench, wherein a portion of the conductive material outside a footprint of the trench remains exposed from the photoresist layer;
   etching the seed layer around the conductive material, including the portion of the seed layer, using the photoresist layer as a mask in a first etching step, wherein the portion of the conductive material remains after etching the seed layer;
   removing the photoresist layer after the first etching step; and
   etching the conductive material in a second etching step after removing the photoresist layer, wherein the portion of the conductive material is removed.

2. The method of claim 1, further including etching the conductive material until a surface of the conductive material is coplanar to a surface of the second dielectric layer.

3. The method of claim 1, further including depositing the conductive material using a bottom-up filling deposition technique until a thickness of conductive material over the second dielectric layer is between 1 and 2 micrometers (μm).

4. The method of claim 1, wherein etching the seed layer removes a portion of the seed layer encircling the trench.

5. The method of claim 1, further including:
   depositing an encapsulant around the semiconductor die; and
   forming a fan-out interconnect structure over the semiconductor die and encapsulant.

6. A method of making a semiconductor device, comprising:
   forming a dielectric layer;
   forming a trench in the dielectric layer;
   forming a seed layer in the trench;
   depositing a conductive material in the trench;
   forming a photoresist layer over the conductive material in the trench, wherein a portion of the conductive material remains exposed from the photoresist layer;
   etching the seed layer around the conductive material using the photoresist layer and the portion of the conductive material as a mask in a first etching step;
   removing the photoresist layer after the first etching step; and
   etching the conductive material in a second etching step after removing the photoresist layer.

7. The method of claim 6, further including continuing the second etching step until a surface of the conductive material is coplanar to a surface of the dielectric layer.

8. The method of claim 6, further including depositing the conductive material using a bottom-up filling deposition technique until a surface of the conductive material is coplanar to a surface of the dielectric layer.

9. The method of claim 6, wherein the first etching step removes a portion of the seed layer encircling the trench.

10. The method of claim 6, further including forming a fan-out interconnect structure over the conductive material and dielectric layer.

11. The method of claim 6, wherein the conductive material includes copper, and the seed layer includes titanium.

12. The method of claim 6, further including:
   providing a semiconductor die;
   depositing an encapsulant around the semiconductor die; and
   forming the dielectric layer over the semiconductor die and encapsulant.

13. A method of making a semiconductor device, comprising:
   forming an insulating layer;
   forming a trench in the insulating layer;
   forming a seed layer in the trench;
   depositing a conductive material in the trench, wherein the conductive material is overburdened from the trench and a portion of the seed layer remains exposed from the conductive material;
   forming a photoresist layer over the conductive material in the trench, wherein a portion of the conductive material outside a footprint of the trench remains exposed from the photoresist layer;
   etching the seed layer around the conductive material, including the portion of the seed layer, using the photoresist layer as a mask, wherein the portion of the conductive material remains after etching the seed layer;
   removing the photoresist layer after etching the seed layer; and
   etching the conductive material after removing the photoresist layer, wherein the portion of the conductive material is removed.

14. The method of claim 13, further including depositing the conductive material using a bottom-up filling technique until a surface of the conductive material is coplanar to a surface of the insulating layer.

15. The method of claim 13, further including etching the conductive material until a surface of the conductive material is coplanar to a surface of the insulating material in a second etching step separate from the step of etching the seed layer around the conductive material.

16. The method of claim 13, further including forming a fan-out interconnect structure over the conductive material and insulating layer.

17. The method of claim 13, wherein the conductive material includes copper, and the seed layer includes titanium.

18. The method of claim 13, further including:
providing a semiconductor die;
depositing an encapsulant around the semiconductor die; and
forming the dielectric layer over the semiconductor die and encapsulant.

19. A method of making a semiconductor device, comprising:
forming an insulating layer;
forming a trench in the insulating layer;
forming a seed layer in the trench;
depositing a conductive material in the trench over the seed layer;
forming a photoresist layer over the trench, wherein a portion of the conductive material remains exposed from the photoresist layer; and
etching the seed layer around the trench using the photoresist layer and the portion of the conductive material as a mask; and
etching the conductive material in a second etching step after etching the seed layer.

20. The method of claim 19, wherein etching the seed layer removes a portion of the seed layer around the trench.

21. The method of claim 19, further including forming a fan-out interconnect structure over the insulating layer.

22. The method of claim 19, further including:
providing a semiconductor die;
depositing an encapsulant around the semiconductor die; and
forming the dielectric layer over the semiconductor die and encapsulant.

23. The method of claim 19, further including forming a via in the trench.

24. The method of claim 13, wherein the step of etching the conductive material is performed by chemical etching and results in coplanar top surfaces of the conductive material and insulating layer.

* * * * *